(12) United States Patent
Shau (10) Patent No.: US 8,947,129 B2
(45) Date of Patent: Feb. 3, 2015

(54) HIGH VOLTAGE SWITCHING CIRCUITS

(71) Applicant: Jeng-Jye Shau, Palo Alto, CA (US)

(72) Inventor: Jeng-Jye Shau, Palo Alto, CA (US)

( * ) Notice: Subject to any disclaimer, the term of this patent is extended or adjusted under 35 U.S.C. 154(b) by 42 days.

(21) Appl. No.: 13/779,761

(22) Filed: Feb. 28, 2013

(65) Prior Publication Data

US 2014/0240028 A1 Aug. 28, 2014

(51) Int. Cl.
*H03B 1/00* (2006.01)
*H03K 17/687* (2006.01)

(52) U.S. Cl.
CPC .................... *H03K 17/6874* (2013.01)
USPC ........................................... 327/108; 327/112

(58) Field of Classification Search
None
See application file for complete search history.

(56) References Cited

U.S. PATENT DOCUMENTS

| | | | | |
|---|---|---|---|---|
| 6,054,888 A * | 4/2000 | Maley | .......................... | 327/333 |
| 6,140,846 A * | 10/2000 | Chan et al. | .................... | 327/108 |
| 6,317,342 B1 | 11/2001 | Noworolski et al. | | |
| 6,593,781 B2 * | 7/2003 | Yoshimura | ..................... | 327/110 |
| 7,548,098 B2 * | 6/2009 | Martines et al. | ............... | 327/112 |
| 8,054,111 B2 * | 11/2011 | Osame et al. | .................. | 327/112 |
| 8,487,664 B2 * | 7/2013 | Draxelmayr et al. | ......... | 327/108 |
| 8,692,587 B1 * | 4/2014 | Dijk et al. | ...................... | 327/108 |
| 2008/0068050 A1 * | 3/2008 | Ajit | ............................... | 327/108 |
| 2011/0128047 A1 * | 6/2011 | Wang | .............................. | 327/108 |
| 2013/0162300 A1 * | 6/2013 | Liu et al. | ........................ | 327/108 |
| 2013/0285713 A1 * | 10/2013 | Acar et al. | ..................... | 327/110 |
| 2014/0002107 A9 * | 1/2014 | Leflour | ......................... | 324/637 |
| 2014/0103966 A1 * | 4/2014 | Wang et al. | .................... | 327/108 |

* cited by examiner

*Primary Examiner* — Tuan T Lam (57) ABSTRACT

The preferred embodiments of the present invention use low voltage transistors to support high voltage switching circuits by connecting low voltage circuits in a stacking configuration. High voltage switching signals are divided into a plurality of small amplitude switching signals before sending into transformers, filters or other circuits. The resulting circuits can support high voltage applications while achieving cost and performance advantages of low voltage circuits.

20 Claims, 11 Drawing Sheets

HIGH VOLTAGE SWITCHING CIRCUITS

BACKGROUND OF THE INVENTION

The present invention relates to high voltage electrical circuits for generating high frequency switching signals, and more particularly to high voltage switching circuits supported by low voltage transistors.

Figure 1:
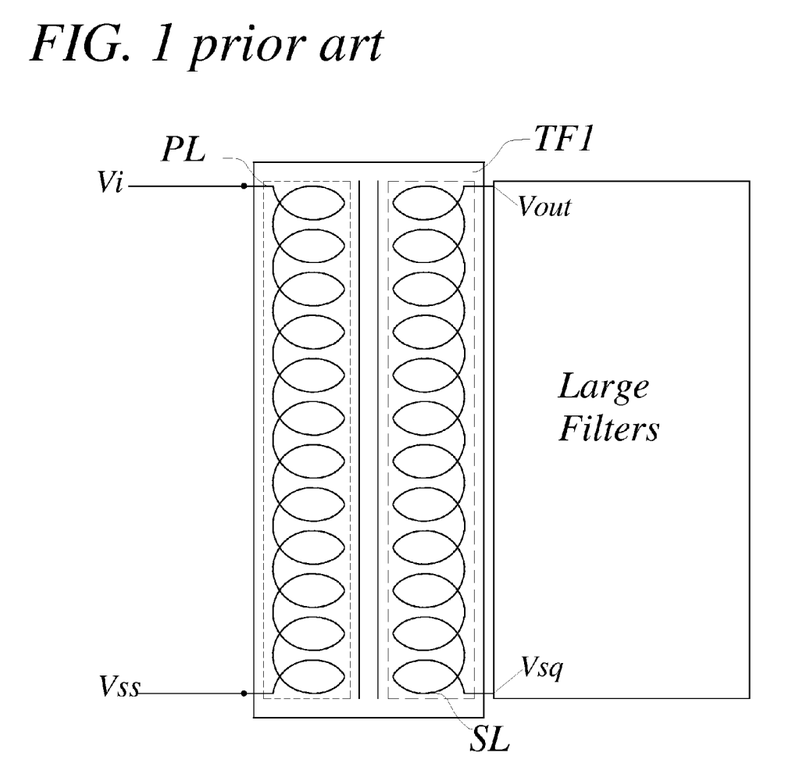
FIG. 1 is a symbolic diagram illustrating the structures of a prior art voltage converting circuit.

The symbolic diagram in FIG. 1 illustrates typical structures of prior art voltage converting circuits. The input source voltage (Vi) and input ground voltage (Vss) are connected to a transformer (TF1), and the output voltages (Vout, Vsq) of the transformer (TF1) are connected to filters for further processing. The transformer (TF1) is a static electrical device that transfers energy by inductive coupling between its winding circuits. The input voltages (Vi, Vss) cause a varying current in the primary winding (PL) that creates a varying magnetic flux in the transformer's core and thus a varying magnetic flux through the secondary winding (SL). This varying magnetic flux induces a varying electrical field in the secondary winding that generates the output voltages (Vout, Vsq). At ideal conditions, the relationship between the input and output voltages of the transformer is $(Vi-Vss)/(Vout-Vsq)=Np/Ns$, where Np is the number of turns in the primary coil, and Ns is the number of turns in the secondary coil of the transformer. By proper selection of Np and Ns, desired output voltages can be generated. Galvanic isolation is also achieved because the input ground voltage (Vss) and the output ground voltage (Vsq) of a transformer can have different voltage values.

Figure 2A:
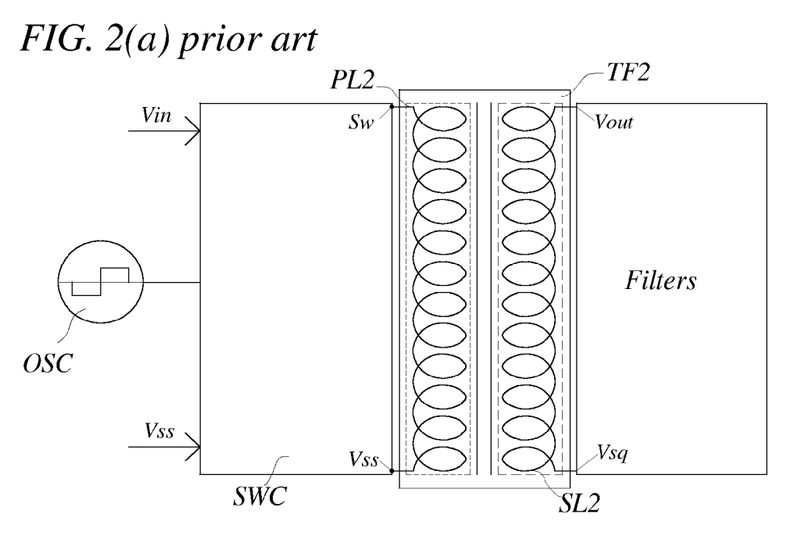
Figure 2B:
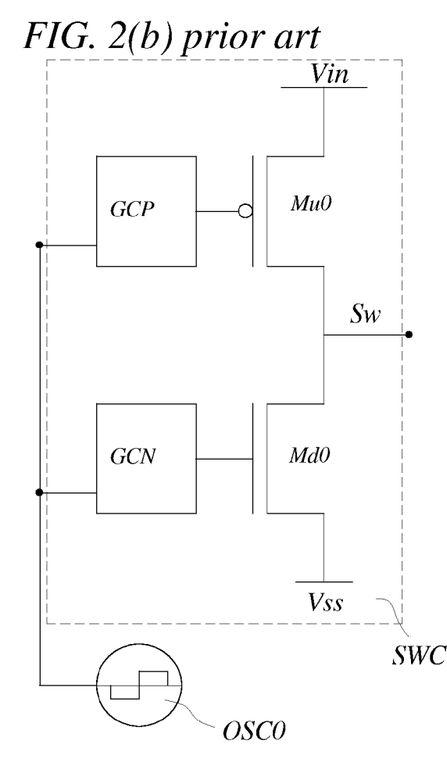
Figure 2C:
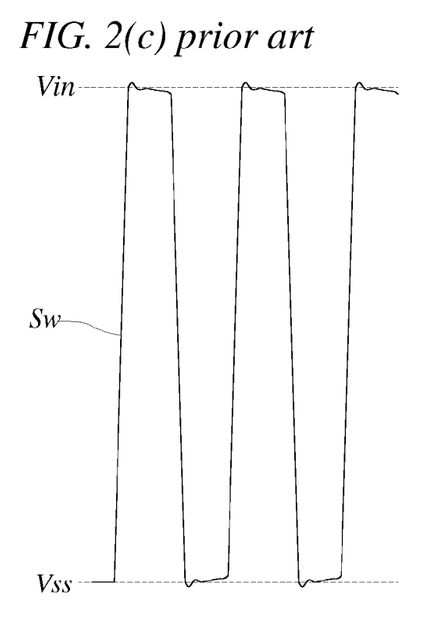

The prior art circuit illustrated in FIG. 1 works very well except when the input voltage (Vi) is a slow varying signal (for example, slower than 200 cycles per second). Slow varying input signals require transformers with large inductance values, and the filters also need large capacitors and/or inductors. The required circuit elements, such as transformers and/or filters, used to support low frequency input signals are typically bulky and expensive. FIGS. 2(a-c) illustrates typical prior art solutions for this problem. A switching circuit block (SWC) is placed between the slow varying input voltages (Vin, Vss) and the transformer (TF2), as illustrated by the symbolic diagram in FIG. 2(a). This prior art switching circuit block (SWC) typically comprises a transistor (Mu0) for providing a driving force to pull the output signal (Sw) of the circuit block (SWC) toward Vin when it is enabled and a transistor (Md0) for providing a driving force to pull Sw toward Vss when it is enabled, as illustrated by the symbolic diagram in FIG. 2(b). Control circuits (GCP, GCN) synchronized by an oscillator (OSC0) control the timing of the switching circuits to generate an output signal (Sw) that switches between Vin and Vss, as illustrated by the waveform shown in FIG. 2(c). In this way, the inputs to the transformer (TF2) and/or the filters are high frequency switching signals. Therefore, desired outputs can be generated without using expensive, bulky, low frequency electrical components.

The prior art circuit illustrated in FIG. 2(a-c) works very well except when the input voltage (Vi) is at high voltage. The driving transistors (Mu0, Md0) used by the switching circuit (SWC) in FIG. 2(b) need to tolerate the maximum voltage differences between Vin and Vss. If the input voltage (Vin) is a high voltage signal, then Mu0 and Md0 need to be high voltage transistors. Logic transistors supported by Integrated Circuit (IC) technologies typically operate at voltages lower than 6 volts. Transistors that can tolerate more than 12 volts are typically more expensive because they require additional steps during the manufacturing process. Transistors that can tolerate more than 30 volts typically are not available in IC technologies; they are manufactured by special methods as discrete components, and they are much more expensive and bulky. Transistors that can tolerate more than 100 volts are difficult to manufacture, and are bulky and expensive. The performance of high voltage transistors is typically much lower than the performance of low voltage transistors. Low performance of high voltage transistors limits the achievable frequencies of the switching output signals, thus limiting the capability to use smaller transformers and/or filters. In addition, switching high voltage signals waste more energy than switching low voltage signals. It is therefore highly desirable to support high voltage switching circuits using common low voltage transistors.

SUMMARY OF THE PREFERRED EMBODIMENTS

A primary objective of the preferred embodiments is, therefore, to support high voltage switching circuits using low voltage transistors. An objective of the preferred embodiment is to increase the output frequencies of high voltage switching circuits, allowing the use of smaller electrical components. Another objective of the preferred embodiment is to build high voltage switching circuits using common IC technologies. Another primary objective of the preferred embodiment is to improve the energy efficiency of high voltage switching circuits. These and other objectives are assisted by stacking low voltage circuit blocks to perform high voltage switching operations.

While the novel features of the invention are set forth with particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 2(a-c) illustrate prior art switching circuits designed to solve the low frequency problems of the prior art circuit in FIG. 1;

DETAILED DESCRIPTION OF THE PREFERRED EMBODIMENTS

Figure 3A:
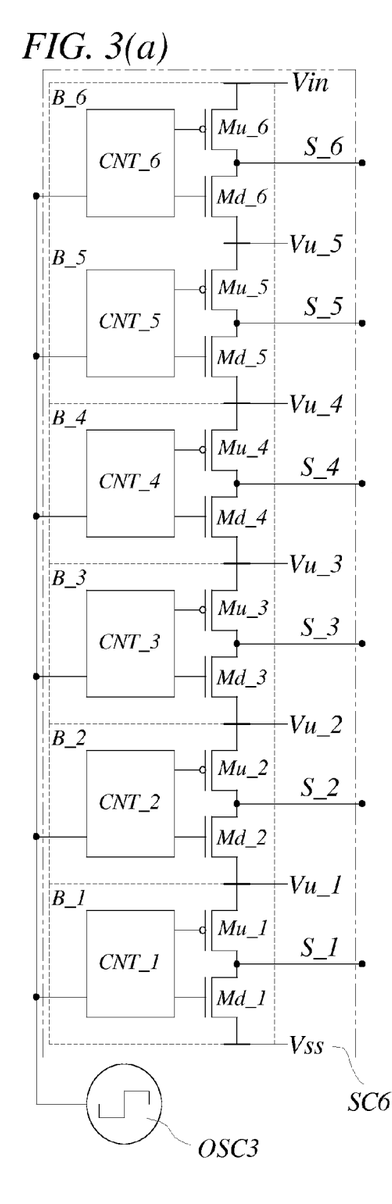
FIG. 3(a) shows an example of an electrical circuit that can support high voltage switching circuits using low voltage transistors.
Figure 3B:
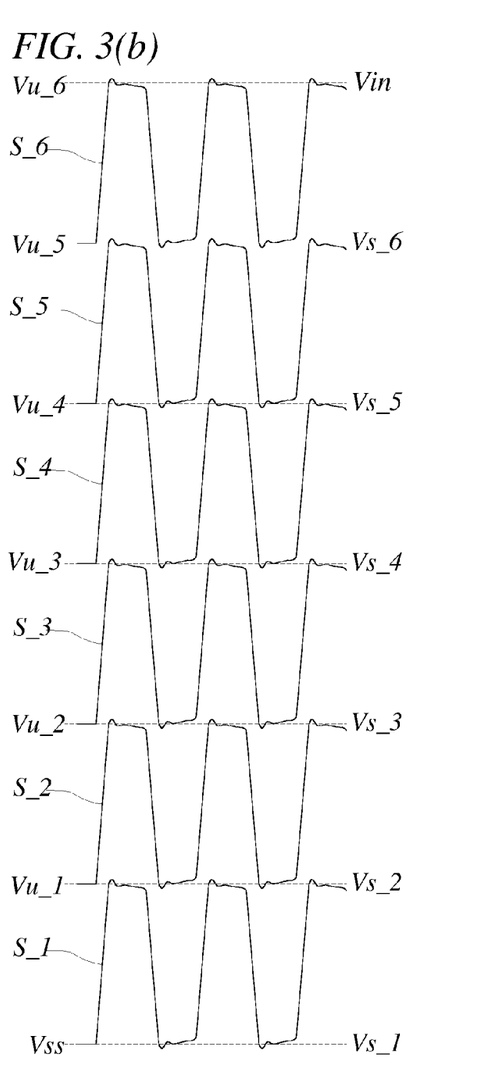
FIG. 3(b) shows examples of the waveforms of the output signals generated by the circuit in FIG. 3(a)

FIGS. 3(a-c) show an example of a switching circuit (SC6) of the present invention. The switching circuit (SC6) comprises an input voltage connection that connects to an input voltage (Vin), an input ground voltage connection that connects to an input ground voltage (Vss), and a plurality of circuit blocks (B_1-B_6) connected in a stacking configuration. Referring to FIGS. 3(a, b), the first circuit block (B_1) outputs a switching signal (S_1). This switching signal (S_1) switches between the upper voltage (Vu_1) and the lower voltage (Vs_1) of the first circuit block (B_1). The first circuit block (B_1) comprises a transistor (Mu_1) for providing a driving force to pull S_1 toward Vu_1 while Mu_1 is enabled and a transistor (Md_1) for providing a driving force to pull S_1 toward Vs_1 while Md_1 is enabled. The gates of Mu_1 and Md_1 are controlled by a control circuit (CNT_1) that uses the output of an external oscillator (OSC3) as timing reference. The voltage value of Vu_1 is between the voltage value of said input voltage (Vin) and the voltage value of Vs_1. The voltage value of Vs_1 is between the voltage value of Vu_1 and the voltage value of the input ground voltage (Vss). For the example shown in FIGS. 6(a, b), Vs_1 is connected to Vss.

The second circuit block (B_2) outputs a switching signal (S_2) that switches between its upper voltage (Vu_2) and its lower voltage (Vs_2). This second circuit block (B_2) comprises a transistor (Mu_2) for providing a driving force to pull S_2 toward Vu_2 while Mu_2 is enabled and a transistor (Md_2) for providing a driving force to pull S_2 toward Vs_2 while Md_2 is enabled. The gates of Mu_2 and Md_2 are controlled by a control circuit (CNT_2) that uses the output of the external oscillator (OSC3) as timing reference. The voltage value of Vu_2 is between the voltage value of the input voltage (Vin) and the voltage value of Vs_2. The voltage value of Vs_2 is between the voltage value of Vu_2 and the voltage value of the lower voltage (Vs_1) of the first circuit block (B_1). For the example shown in FIGS. 3(a, b), Vs_2 is connected to Vu_1.

The other circuit blocks are connected following similar patterns so that the third circuit block (B_3) outputs a switching signal (S_3) that switches between its upper voltage (Vu_3) and its lower voltage (Vs_3). This third circuit block (B_3) comprises a transistor (Mu_3) for providing a driving force to pull S_3 toward Vu_3 while Mu_3 is enabled and a transistor (Md_3) for providing a driving force to pull S_3 toward Vs_3 while Md_3 is enabled. The gates of Mu_3 and Md_3 are controlled by a control circuit (CNT_3) that uses the output of the external oscillator (OSC3) as timing reference. The voltage value of Vu_3 is between the voltage value of the input voltage (Vin) and the voltage value of Vs_3. The voltage value of Vs_3 is between the voltage value of Vu_3 and the voltage value of the lower voltage (Vs_2) of the second circuit block (B_2). For the example shown in FIGS. 3(a, b), Vs_3 is connected to Vu_2.

The fourth circuit block (B_4) outputs a switching signal (S_4) that switches between its upper voltage (Vu_4) and its lower voltage (Vs_4) except for temporary overshoots or undershoots. This forth circuit block (B_4) comprises a transistor (Mu_4) for providing a driving force to pull S_4 toward Vu_4 while Mu_4 is enabled and a transistor (Md_4) for providing a driving force to pull S_4 toward Vs_4 while Md_4 is enabled. The gates of Mu_4 and Md_4 are controlled by a control circuit (CNT_4) that uses the output of the external oscillator (OSC3) as timing reference. The voltage value of Vu_4 is between the voltage value of the input voltage (Vin) and the voltage value of Vs_4. The voltage value of Vs_4 is between the voltage value of Vu_4 and the voltage value of the lower voltage (Vs_3) of the third circuit block (B_3). For the example shown in FIGS. 3(a, b), Vs_4 is connected to Vu_3.

The fifth circuit block (B_5) outputs a switching signal (S_5) that switches between its upper voltage (Vu_5) and its lower voltage (Vs_5). This fifth circuit block (B_5) comprises a transistor (Mu_5) for providing a driving force to pull S_5 toward Vu_5 while Mu_5 is enabled and a transistor (Md_5) for providing a driving force to pull S_5 toward Vs_5 while Md_5 is enabled. The gates of Mu_5 and Md_5 are controlled by a control circuit (CNT_5) that uses the output of the external oscillator (OSC3) as timing reference. The voltage value of Vu_5 is between the voltage value of the input voltage (Vin) and the voltage value of Vs_5. The voltage value of Vs_5 is between the voltage value of Vu_5 and the voltage value of the lower voltage (Vs_4) of the fourth circuit block (B_4). For the example shown in FIGS. 3(a, b), Vs_5 is connected to Vu_4.

The sixth circuit block (B_6) outputs a switching signal (S_6) that switches between its upper voltage (Vu_6) and its lower voltage (Vs_6). This sixth circuit block (B_6) comprises a transistor (Mu_6) for providing a driving force to pull S_6 toward Vu_6 while Mu_6 is enabled and a transistor (Md_6) for providing a driving force to pull S_6 toward Vs_6 while Md_6 is enabled. The gates of Mu_6 and Md_6 are controlled by a control circuit (CNT_6) that uses the output of the external oscillator (OSC3) as timing reference. The voltage value of Vu_6 is between the voltage value of the input voltage (Vin) and the voltage value of Vs_6. The voltage value of Vs_6 is between the voltage value of Vu_6 and the voltage value of the lower voltage (Vs_5) of the fifth circuit block (B_5), as illustrated in FIG. 3(a). For the example shown in FIGS. 3(a, b), Vs_6 is connected to Vu_5, and Vu_6 is connected to Vin.

Figure 3C:
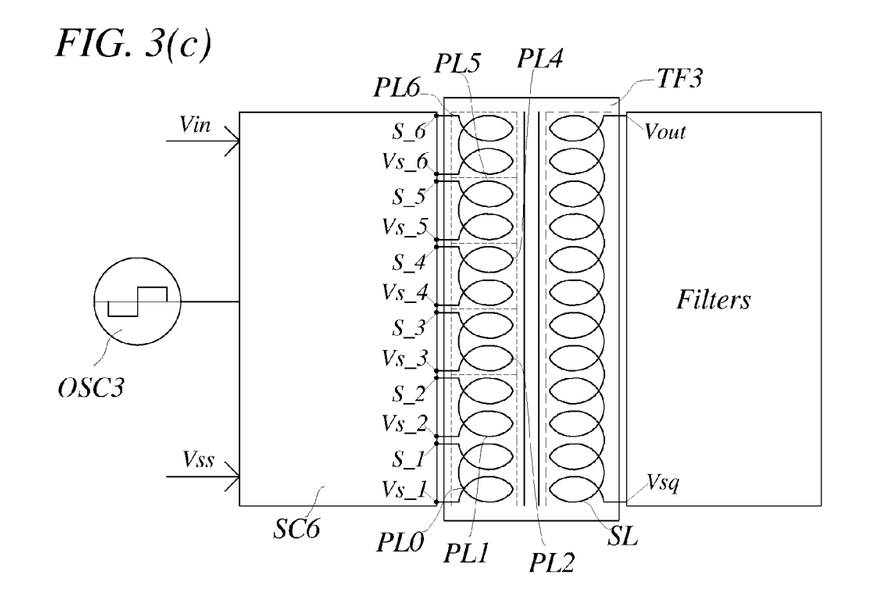
FIG. 3(c) shows an example of using the circuit in FIG. 3(a) in combination with transformers and filters.

The prior art switching circuit (SWC) in FIG. 2(b) uses one stage of switching circuit that provides an output signal switching between Vin and Vss, so that the switching circuit must tolerate the full voltage drop between Vin and Vss. The switching circuit (SC6) in FIG. 3(a) has a plurality of circuit blocks (B_1-B_6) connected in a stacking configuration so that the voltage drops between Vin and Vss can be distributed among those circuit blocks (B_1-B_6). The total amplitude of the output signal is divided into a plurality of output signals (S_1-S_6) with smaller individual amplitudes. Theses output signals (S_1-S_6) can be connected to a transformer (TF3) that has a plurality of input loops (PL0-PL6), as shown in FIG. 3(c), to support the same function as the circuit in FIG. 2(a). The functions of the circuit in FIG. 2(a) and the functions of the circuit in FIG. 3(c) can be the same if the number of turns in individual input loops (PL0-PL6) are proportional to the amplitudes of corresponding switching signals (S_1-

S__6). In such ways, the functions of high voltage transistors can be supported by low voltage transistors.

This patent application often uses the terminology that "a voltage value (V) is between one voltage value (V1) and another voltage value (V2)". By definition used in this patent application, when "a voltage value (V) is between a first voltage value (V1) and a second voltage value (V2)", that includes the conditions when V is equal to V1 or when V is equal to V2. The upper (Vu__1-Vu__6) and lower (Vs__1-Vs__6) voltages of output signals (S__1-S__6) are not necessary constant voltage levels. They can vary with operation conditions. The amplitudes of output signals (S__1-S__6) are also not necessary constant. In addition, the voltage relationships between the upper (Vu__1-Vu__6) and the lower (Vs__1-Vs__6) voltages of output signals (S__1-S__6) are referring to their relationships at normal operation conditions. The relationship maybe different when the switching circuits are not at normal operation conditions, such as conditions when the power is shut down, when the circuit is just powered up, or when the circuit is attacked by power glitches.

While the preferred embodiments have been illustrated and described herein, other modifications and changes will be evident to those skilled in the art. It is to be understood that there are many other possible modifications and implementations so that the scope of the invention is not limited by the specific embodiments discussed herein. For examples, in FIGS. 3(a, b) the lower voltage of a circuit block is always connected to the upper voltage of the previous circuit block, but they do not need to be connected in this way, as later shown by the example in FIG. 6(c). The driving transistors (Mu1-Mu6) do not always need to be p-channel MOS transistors, and (Md1-Md6) do not always need to be n-channel transistors. Parallel MOS transistors or serial MOS transistors are considered to be equivalent to one transistor. Other types of circuits such as bipolar transistors or multiple transistors are also applicable. The waveforms shown in our examples are square waves, while other waveforms are also applicable. The switching signals (S__1-S__6) may have temporary overshoots or undershoots beyond the upper and lower voltages, as illustrated by the example waveforms in FIG. 3(b), but it is designed to swing between the upper and lower voltages. In this patent application, we will use the term "switching mostly between voltage 1 and voltage 2" to describe a waveform that is switching between two voltages but may have temporary overshoots and/or undershoots beyond the two voltages. The amplitudes of the output signals (S__1-S__6) do not need to be the same, and the timing of those waveforms do not need to be synchronized. Additional voltage dividing circuits can be used to control the amplitudes of those switching signals. It is also possible to allow the natural dynamic impedance of the switching circuit blocks to determine the amplitudes of the output signals. The timing of control circuits (CNT__1-CNT__6) can refer to internal, external or multiple timing references. The examples of switching circuits discussed in this patent application are connected to transformers and filters, while the applications of the circuits of the present inventions are not limited to circuits that have transformers and/or filters. The input voltage (Vi) can be a constant voltage, a near-constant voltage with ripples, a varying voltage, or other types of waveforms. The upper voltages and the lower voltages of switching circuit blocks do not need to be constant voltages. They are typically variable under different operation conditions. Each individual circuit block (S__1-S6) does not need to be physically separated from other circuit blocks. The electrical components of different circuit blocks may be mixed in physical layout positions. For example, a physical layout may place n-channel transistors belong to different circuit blocks together in one place, while placing p-channel transistors belong to different circuit blocks together in another place. The boundaries of the switching circuit blocks (S__1-S6) are therefore defined by their voltages, not by their physical locations.

Figure 4A:
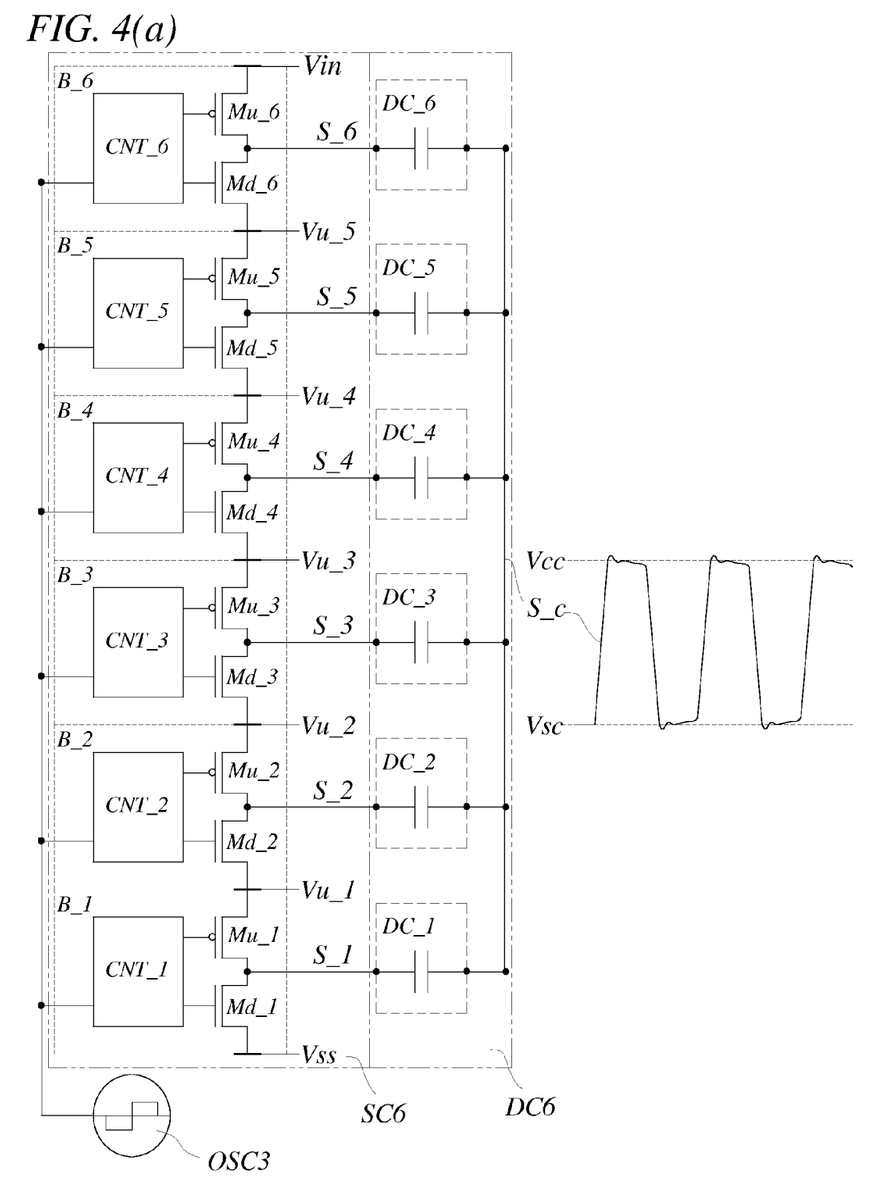
FIG. 4(a) shows an example of an electrical circuit that connects the output signals of the circuit in FIG. 3(a) to decoupling circuits to generate an averaged output signal.

The circuit in FIG. 3(c) uses a transformer (TF3) that has a plurality of input loops (PL1-PL6); such a transformer is not a typically transformer. It is therefore desirable to be able to use a typical transformer that has one input loop and one output loop. FIG. 4(a) shows an example when the output signals (S__1-S__6) of the switching circuit (SC6) in FIG. 3(a) are connected to decoupling circuits (DC6). Decoupling capacitors (DC__1-DC__6) are used as examples for the decoupling circuits in FIG. 4(a), while other types of decoupling circuits also can be used. The outputs of those decoupling capacitors (DC__1-DC__6) are connected together to generate one output signal (S_c) that switches between voltage Vcc and Vsc, as illustrated in FIG. 4(a). The amplitude of this output signal S_c is a weighted average of the amplitudes of the switching signals (S__1-S__6) connected to those decoupling circuits (DC6). For the simplest case when the capacitance values of the decoupling capacitors (DC__1-DC__6) are all the same, the amplitude of the output signal (S_c) is equal to the average amplitudes of the switching signals (S__1-S__6). This average output signal (S_c) can be connected to a transformer (TF4) that has one input loop, as illustrated by the symbolic diagram in FIG. 4(b), and the resulting circuit can have the same functions as the circuits in FIG. 2(a) and in FIG. 3(c). In this way, we can use a much smaller transformer to support the same functions.

Using low voltage transistors to replace high voltage transistors will allow us to provide output signals switching at much higher frequencies than prior art high voltage switching circuits. It is therefore possible to use transformers, filters, and/or other electrical components that are much smaller at much lower costs. It is also possible to support functions that are not achievable by prior art high voltage switching signals.

While the preferred embodiments have been illustrated and described herein, other modifications and changes will be evident to those skilled in the art. It is to be understood that there are many other possible modifications and implementations so that the scope of the invention is not limited by the specific embodiments discussed herein. For example, the output signals (S__1-S__6) illustrated in the above examples are in phase with one another, while their timing relationship can be more complex.

Figure 5A:
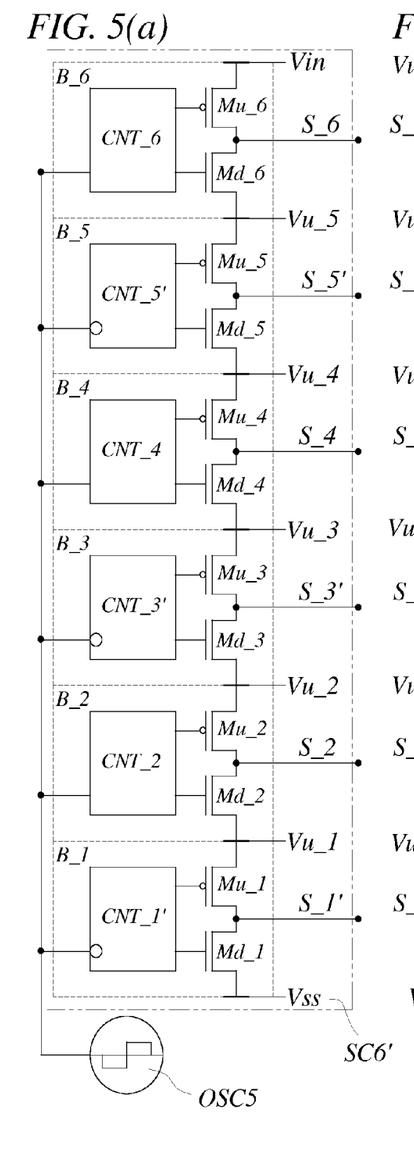
FIG. 5(a) shows an example of an electrical circuit that is similar to the circuit in FIG. 3(a) except the output signals can have different timing patterns.
Figure 5B:
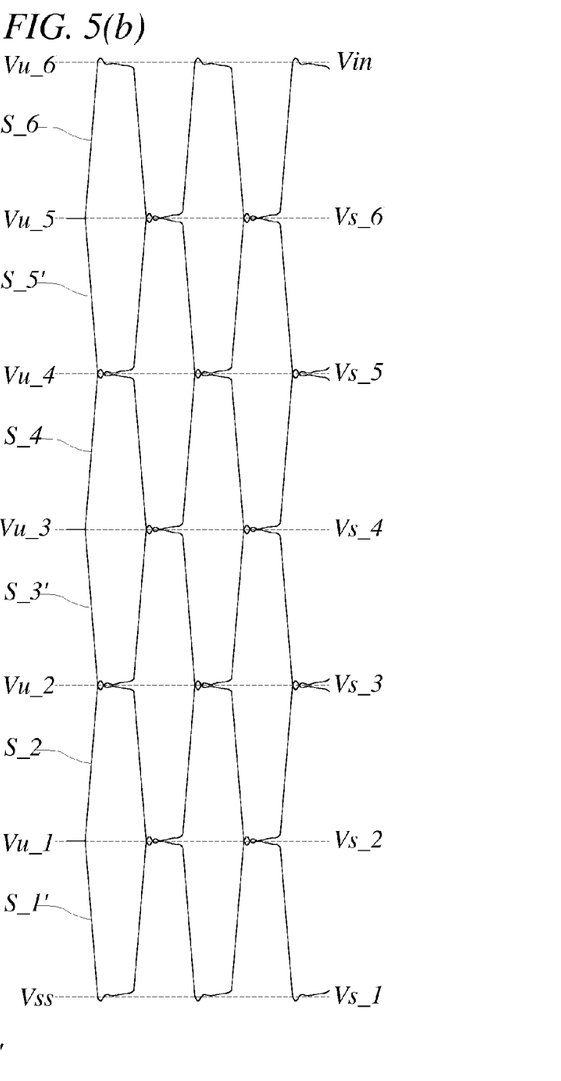
FIG. 5(b) shows examples of the waveforms of the output signals generated by the circuit in FIG. 5(a)
Figure 5C:
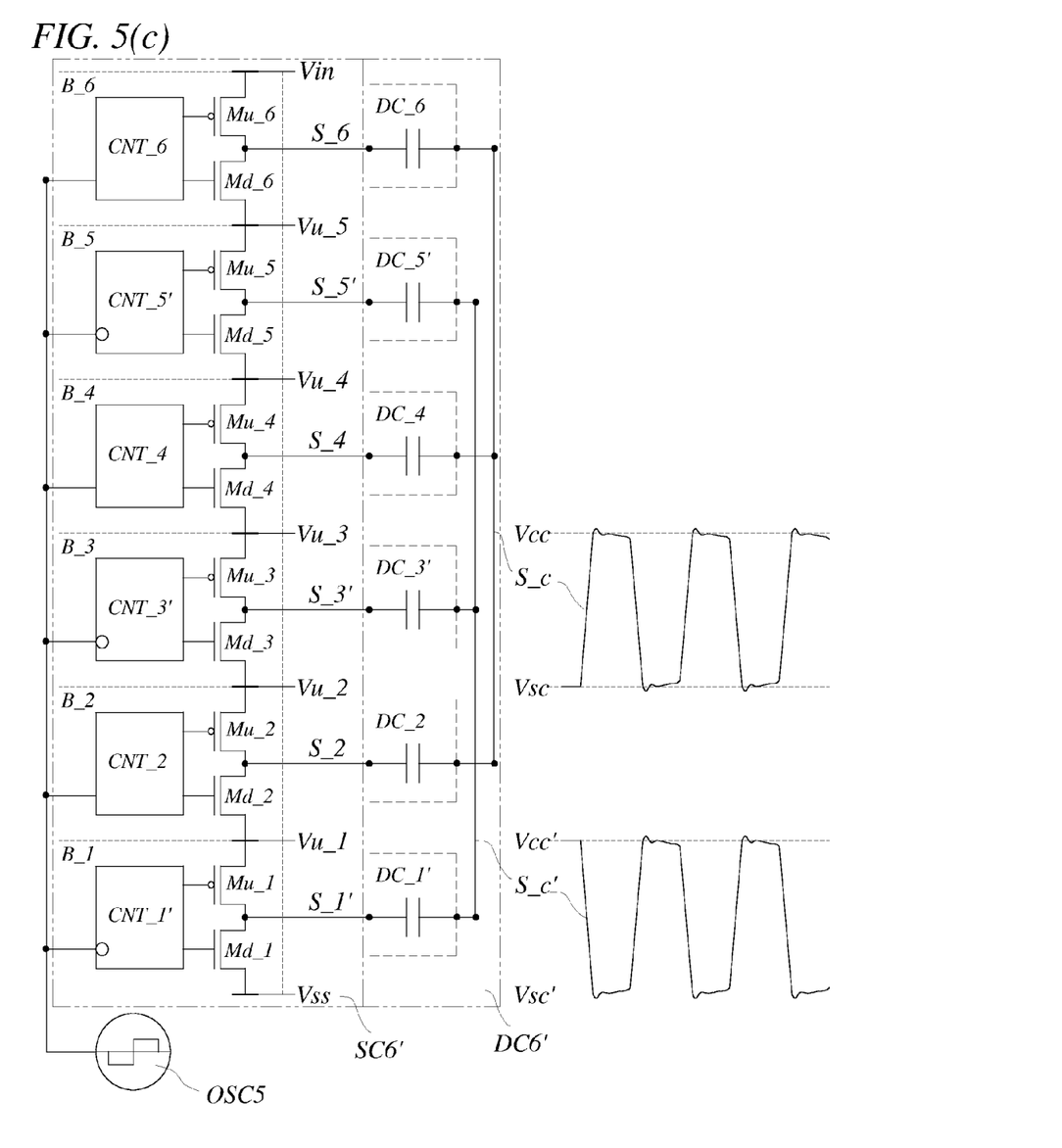
FIG. 5(c) shows an example of an electrical circuit that connects the output signals of the circuit in FIG. 5(a) to decoupling circuits to generate a plurality of averaged output signals.

FIGS. 5(a, b) shows an example when the odd number circuit blocks (B__1', B__3', B__5') of the switching circuit (SC6') in FIG. 5(a) have control circuits (CNT__1', CNT__3', CNT__5') that make half of the output signals (S__1', S__3', S__5') change phase by 180 degrees relative to the corresponding switching signals (S__1, S__3, S__5) shown in FIG. 3(b), as illustrated by the waveforms shown in FIG. 5(b). FIG. 5(c) shows an example when the decoupling circuits are divided into two groups. The even number output signals (S__2, S__4, S__6) of the switching circuit (SC6') in FIG. 5(a) are connected to decoupling circuits (DC__2, DC__4, DC__6) to generate an averaged output signal S_c that switches between Vcc and Vsc. The odd number output signals (S__1', S__3', S__5') are connected to another set of decoupling circuits (DC__1', DC__3', DC__5') to generate another averaged output signal S_c' that switches between Vcc' and Vsc', and it is 180 degree out of phase relative to S_c, as illustrated in FIG. 5(c).

While the preferred embodiments have been illustrated and described herein, other modifications and changes will be evident to those skilled in the art. It is to be understood that there are many other possible modifications and implementations so that the scope of the invention is not limited by the specific embodiments discussed herein. For example, the changes in output voltage timing do not need to happen on half of the circuit blocks, and it does not have to be 180 degree out of phase. Sometimes it is desirable to connect different sets of output signals to different transformers and/or other types of circuits. The switching output signals also can be stacked to generate output voltages with voltage amplitudes higher than the amplitude of each individual output signals. The timing and the amplitude of individual output signals can be changed in wide varieties of configurations to serve different purposes. The configuration on the connections of output switching signals also can be changes in wide varieties of ways to support different applications.

Figure 6A:
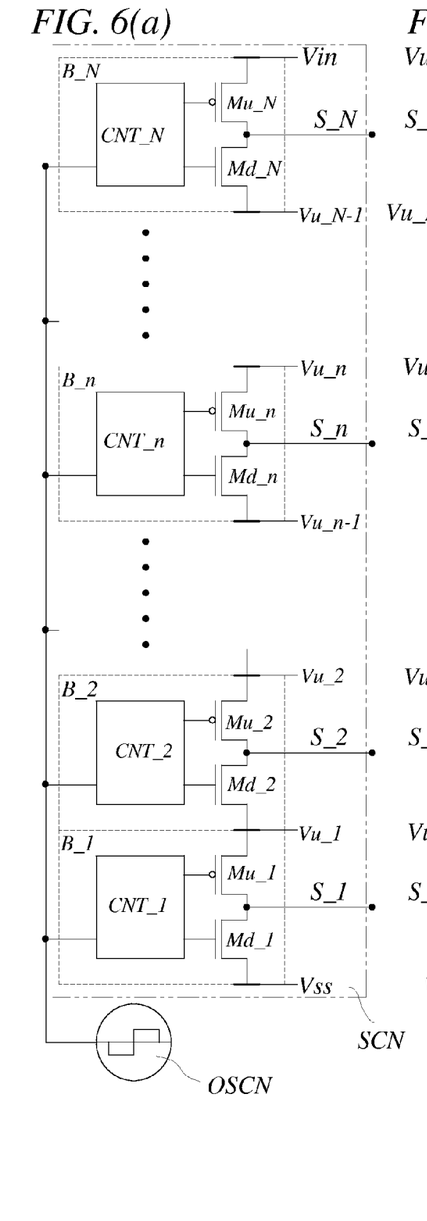
FIG. 6(a) shows an example of a switching circuit that has N stages of circuit blocks.
Figure 6B:
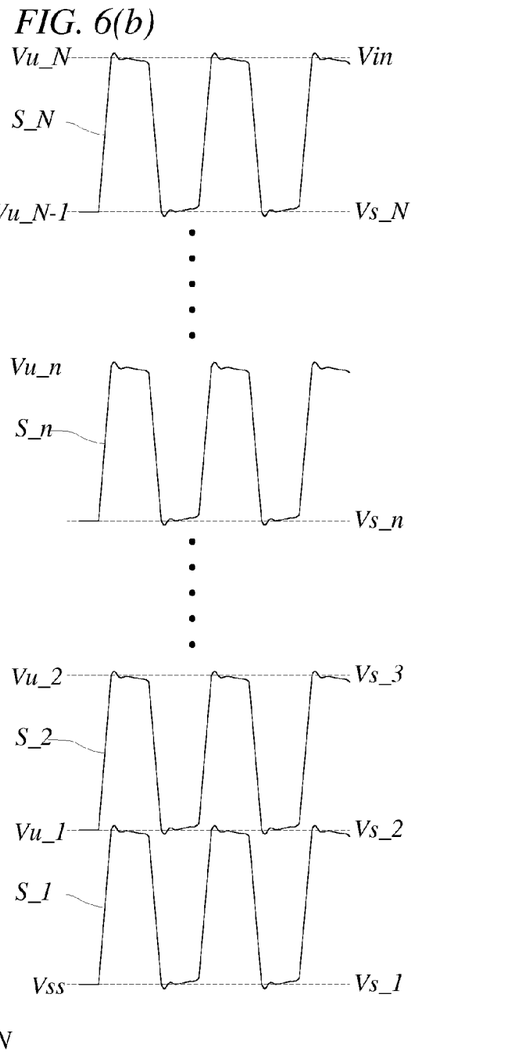
FIG. 6(b) shows examples of the waveforms of the output signals generated by the circuit in FIG. 6(a)
Figure 6C:
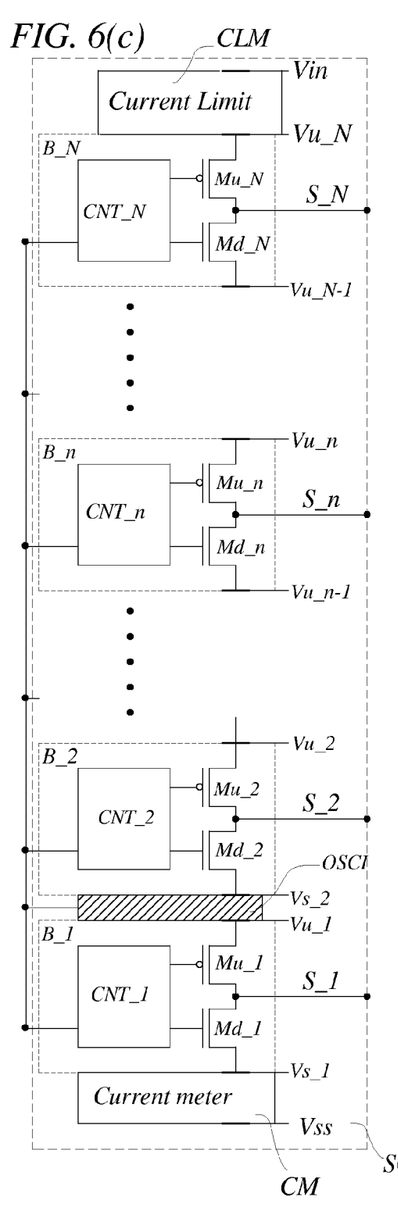
FIG. 6(c) shows an example of a switching circuit that has N stages of circuit blocks in combination with other circuit blocks such as a current limiting circuit block, a current meter, and an oscillator.
Figure 6D:
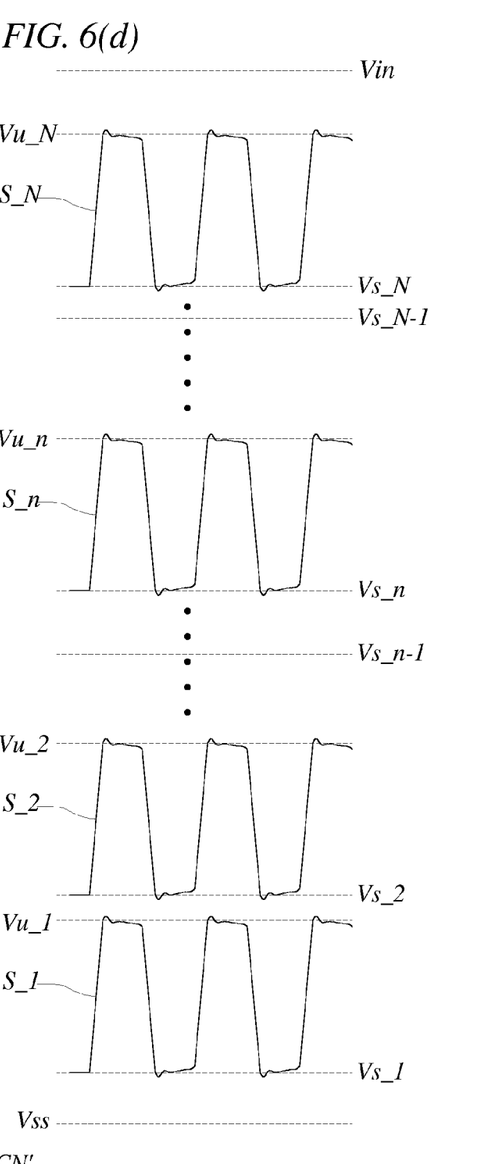
FIG. 6(d) shows examples of the waveforms of the output signals generated by the circuit in FIG. 6(c)

FIG. 6(a) shows an example of a switching circuit (SCN) that is similar in structure to the circuit in FIG. 3(a) except that it has N stages of circuit blocks (B_1, B_2, ..., B_n, ..., B_N), where N is an arbitrary integer that is larger than 3, and n is an integer larger than 1 and smaller than N. Experimental circuits with N ranged from 4 to 10 have been built successfully. Circuits for N as high as 80 have been simulated to be fully functional. For the example in FIG. 6(a), an external oscillator (OSCN) is used to provide timing reference for the switching circuit (SCN). FIG. 6(b) shows examples of the waveforms of the output signals (S_1, S_2, ..., S_n, ..., S_N) generated by the circuit in FIG. 6(a). Sometimes, other circuits such as current limiting circuit (CLM), current meter (CM), internal oscillator (OSCI), or other circuits also can be placed among switching circuit blocks (B_1, B_2, ..., B_n, ..., B_N), as illustrated in FIG. 6(c). For the example in FIG. 6(c), timing reference is provided by the internal oscillator (OSCI) instead of an external oscillator. FIG. 6(d) shows examples of the waveforms of the output signals (S_1, S_2, ..., S_n, ..., S_N) generated by the circuit in FIG. 6(c). As illustrated in FIGS. 6(c, d), the lower voltage of a switching circuit block does not have to be equal to the upper voltage of the previous circuit block, especially when other types of circuits (such as CLM, CM, OSCI) are inserted among switching circuit blocks (S_1, S_2, ..., S_n, ..., S_N).

Referring to FIGS. 6(c, d), the switching circuit (SCN') comprises an input voltage connection that connects to an input voltage (Vin), an input ground voltage connection that connects to an input ground voltage (Vss), and a plurality of circuit blocks (B_1, B_2, ..., B_n, ..., B_N), where N is an integer larger than 3 and n is an integer greater than 1 and smaller than N. The maximum voltage amplitude between Vin and Vss can be higher than 30 volts, 60 volts, 100 volts, or higher. The circuit blocks (B_1, B_2, ..., B_n, ..., B_N) are connected in a stacking relationship. The first circuit block (B_1) outputs a switching signal (S_1). This switching signal (S_1) switches mostly between the upper voltage (Vu_1) and the lower voltage (Vs_1) of the first circuit block (B_1). S_1 may have temporary overshoots or undershoots beyond Vu_1 and Vs_1, as illustrated by the example waveforms in FIG. 6(d), but it is designed to swing mostly between Vu_1 and Vs_1. The first circuit block (B_1) comprises a transistor (Mu_1) for providing a driving force to pull S_1 toward Vu_1 while Mu_1 is enabled and a transistor (Md_1) for providing a driving force to pull S_1 toward Vs_1 while Md_1 is enabled. More than one driving transistors may be used for this purpose. Other types of circuits also can be used for this purpose. For the example in FIG. 6(a), the gates of Mu_1 and Md_1 are controlled by a control circuit (CNT_1) that uses the output of the external oscillator (OSCN) as timing reference. For the example in FIG. 6(c), the control circuit (CNT_1) uses the output of the internal oscillator (OSCI) as timing reference. The voltage value of Vu_1 is between the voltage value of said input voltage (Vin) and the voltage value of Vs_1. The voltage value of Vs_1 is between the voltage value of Vu_1 and the voltage value of the input ground voltage (Vss). For the example shown in FIGS. 6(a, b), Vs_1 is connected to Vss. For the example shown in FIGS. 6(c, d), Vs_1 is connected to a current meter (CM) which is connected to Vss; therefore the lower voltage (Vs_1) of the first circuit block (B_1) in FIGS. 6(c, d) is not necessary at the same potential as Vss.

The second circuit block (B_2) outputs a switching signal (S_2) that switches mostly between its upper voltage (Vu_2) and its lower voltage (Vs_2) except for temporary overshoots/undershoots. This second circuit block (B_2) comprises a transistor (Mu_2) for providing a driving force to pull S_2 toward Vu_2 while Mu_2 is enabled and a transistor (Md_2) for providing a driving force to pull S_2 toward Vs_2 while Md_2 is enabled. For the example in FIG. 6(a), the gates of Mu_2 and Md_2 are controlled by a control circuit (CNT_2) that uses the output of the external oscillator (OSCN) as timing reference. For the example in FIG. 6(c), the control circuit (CNT_2) uses the output of the internal oscillator (OSCI) as timing reference. The voltage value of Vu_2 is between the voltage value of the input voltage (Vin) and the voltage value of Vs_2. The voltage value of Vs_2 is between the voltage value of Vu_2 and the voltage value of the lower voltage (Vs_1) of the first circuit block (B_1). For the example shown in FIGS. 6(a, b), Vs_2 is connected to Vu_1. For the example shown in FIGS. 6(c, d), Vs_2 is connected to another circuit (OSCI) which is connected to Vu_1; therefore the lower voltage (Vs_2) of the second circuit block (B_2) in FIGS. 6(c, d) is not necessarily at the same potential as the upper voltage (Vu_1) of the first circuit block (B_1).

The other circuit blocks are connected following similar patterns so that for an integer n that is larger than 1 and smaller than N, the n'th circuit block (B_n) outputs a switching signal (S_n) that switches mostly between its upper voltage (Vu_n) and its lower voltage (Vs_n). This n'th circuit block (B_n) comprises a transistor (Mu_n) for providing a driving force to pull S_n toward Vu_n while Mu_n is enabled and a transistor (Md_n) for providing a driving force to pull S_n toward Vs_n while Md_n is enabled. The voltage value of Vu_n is between the voltage value of the input voltage (Vin) and the voltage value of Vs_n, and the voltage value of Vs_n is between the voltage value of Vu_n and the voltage value of the lower voltage (Vs_n−1) of the (n−1)'th circuit block (B_n−1). The gates of Mu_n and Md_n are controlled by a control circuit (CNT_n).

The N'th circuit block (B_N) outputs a switching signal (S_N) that switches mostly between its upper voltage (Vu_N) and its lower voltage (Vs_N), and this N'th circuit block (B_N) comprises a transistor (Mu_N) for providing a driving force to pull S_N toward Vu_N while Mu_N is enabled and a transistor (Md_N) for providing a driving force to pull S_N toward Vs_N while Md_N is enabled. The voltage value of Vu_N is between the voltage value of said input voltage (Vin) and the voltage value of Vs_N, and the voltage value of Vs_N is between the voltage value of Vu_N and the voltage value of the lower voltage (Vs_N−1) of the (N−1)'th circuit block. For the example shown in FIGS. 6(a, b), Vu_N is connected to Vin. For the example shown in FIGS. 6(c, d), Vu_N is connected to another circuit (CLM) which is connected to Vin; therefore the upper voltage (Vu_N) of the N'th circuit block (B_N) in FIGS. 6(c, d) is not necessarily at the same potential as Vin.

The transistors (Mu_1, Md_1, Mu_2, Md_2, ..., Mu_n, Md_n, ..., Mu_N, Md_N) used in the circuit blocks (B_1, B_2, ..., B_n, ..., B_N) of the electrical circuit in FIG. 6(c) can be implemented by MOS transistors commonly used for logic circuits. The operation voltages of those MOS transistors can be one third lower than the maximum voltage amplitude between Vin and Vss, one tenth lower than the maximum voltage amplitude between Vin and Vss, or even lower. Those MOS transistors can have gate oxide thicknesses, threshold voltages, channel lengths, or source-to-drain breakdown voltages that are substantially the same as those of MOS transistors commonly used for low voltage logic circuits operating at voltages that are one third of the maximum voltage amplitude between Vin and Vss, one tenth of the maximum voltage amplitude between Vin and Vss, or even lower. Therefore, those MOS transistors can be manufactured on the same semiconductor substrate with typical logic circuits. Low voltage transistors can operate at switching frequencies much higher than high voltage transistors, so that the switching frequencies of the output signals (S_1, S_2, ..., S_n, ..., S_N) can be higher than one million cycles per second (MHZ), ten MHZ, one hundred MHZ, or higher.

Similar to the circuit configuration illustrated in FIG. 3(c), parts or all of the switching output signals (S_1, S_2, ..., S_n, ..., S_N) provided by the circuit blocks (B_1, B_2, ..., B_n, ..., B_N) can be connected to a transformer that has a plurality of inputs at its primary loop.

Figure 4B:
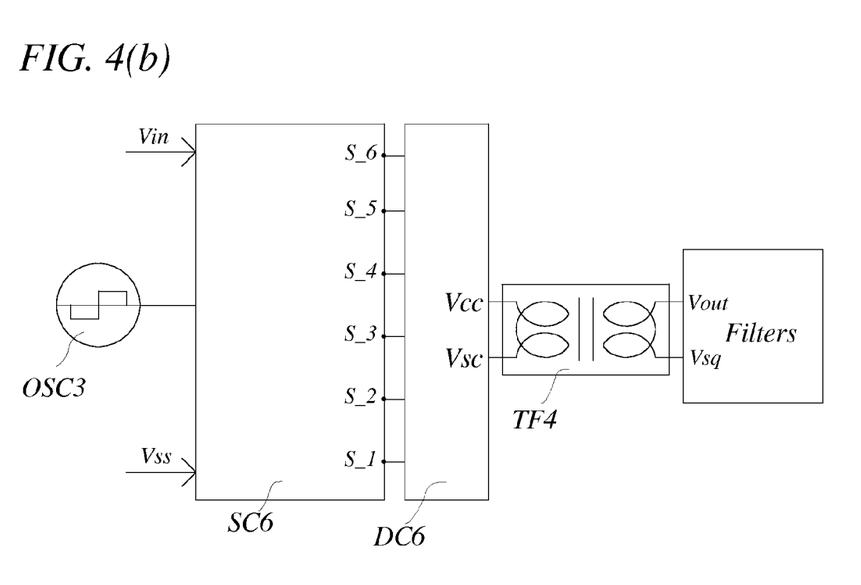
FIG. 4(b) shows an example of using the circuit in FIG. 4(a) in combination with transformers and filters.
Figure 6E:
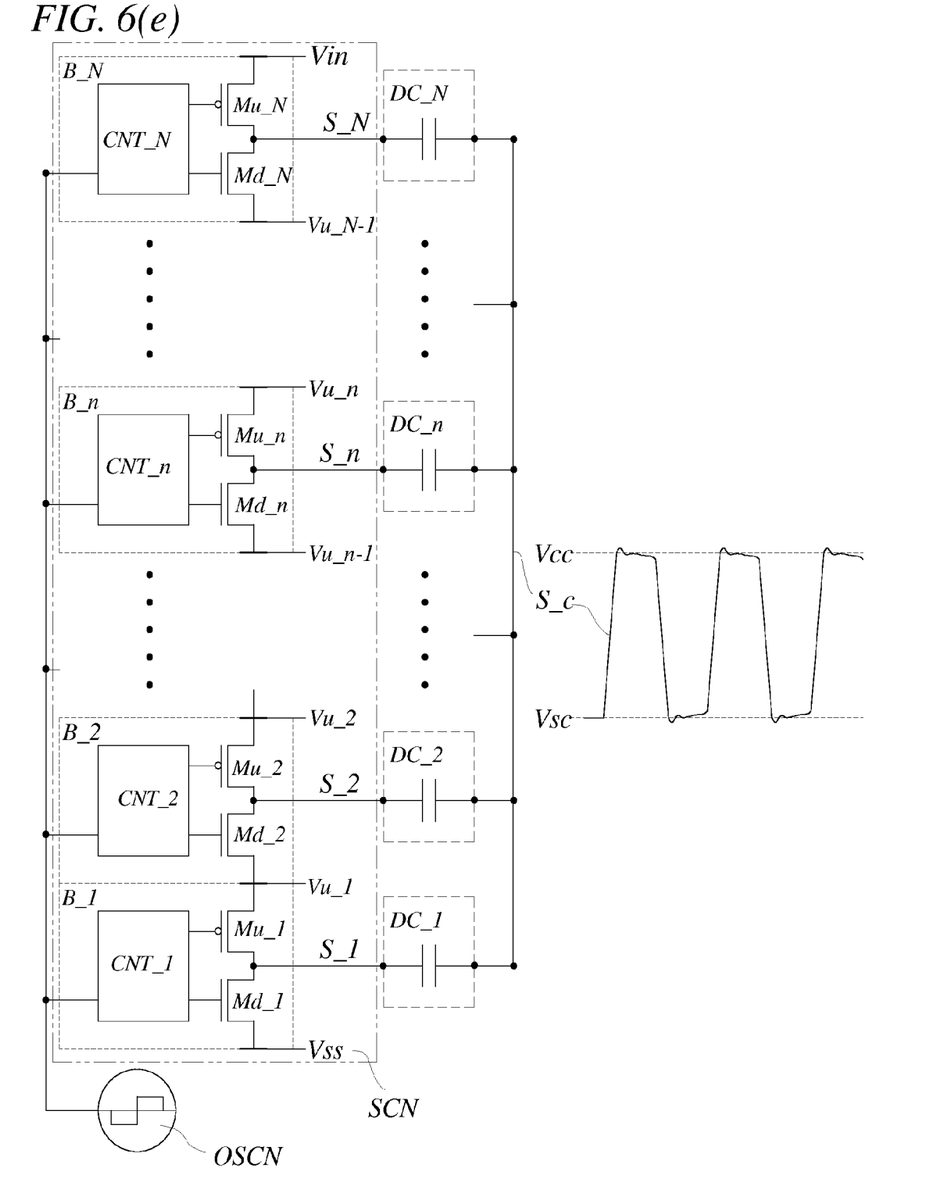
FIG. 6(e) shows an example of an electrical circuit that connects the output signals of the circuit in FIG. 6(a) to decoupling circuits to generate an averaged output signal.

Similar to the circuits illustrated in FIGS. 4(a, b) and FIG. 5(c), parts or all of the switching output signals (S_1, S_2, ..., S_n, ..., S_N) provided by the circuit blocks (B_1, B_2, ..., B_n, ..., B_N) can be connected to the input terminals of decoupling circuit elements where the output terminals of those decoupling circuit elements are connected to the same signal to provide an averaged output signal. For example, the output signals (S_1, S_2, ..., S_n, ..., S_N) of the switching circuit (SCN) in FIG. 6(a) can be connected to decoupling capacitors (DC_1, DC_2, ..., DC_n, ..., DC_N), and the output terminals of those decoupling capacitors can be connected to the same line (S_c) to generate an averaged output signal switching between Vcc and Vsc, as illustrated in FIG. 6(e).

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. An electrical circuit comprising:
   An input voltage connection to an input voltage Vin,
   An input ground connection to an input ground voltage Vss, where the peak voltage amplitude between Vin and Vss is at least 30 volts, and
   A plurality of circuit blocks (B_1, B_2, ..., B_n, ..., B_N), where N is an integer larger than 3 and n is an integer greater than 1 and smaller than N, and said circuit blocks (B_1, B_2, ..., B_n, ..., B_N) are connected in a relationship as:
   the first circuit block (B_1) is connected to a local power at a voltage Vu_1 and a local ground at a voltage Vs_1, said first circuit block (B_1) provides an output signal (S_1) that switches with a switching amplitude substantially the same as the voltage difference between Vu_1 and Vs_1, and said first circuit block (B_1) comprises a transistor (Mu_1) for providing a driving force to pull S_1 toward Vu_1 while Mu_1 is enabled and a transistor (Md_1) for providing a driving force to pull S_1 toward Vs_1 while Md_1 is enabled, where the voltage value of Vu_1 is between the voltage value of said input voltage (Vin) and the voltage value of Vs_1, and the voltage value of Vs_1 is between the voltage value of Vu_1 and the voltage value of said input ground voltage (Vss);
   the second circuit block (B_2) is connected to a local power at a voltage Vu_2 and a local ground at a voltage Vs_2, said second circuit block (B_2) provides an output signal (S_2) that switches with a switching amplitude substantially the same as the voltage difference between Vu_2 and Vs_2, and said second circuit block (B_2) comprises a transistor (Mu_2) for providing a driving force to pull S_2 toward Vu_2 while Mu_2 is enabled and a transistor (Md_2) for providing a driving force to pull S_2 toward Vs_2 while Md_2 is enabled, where the voltage value of Vu_2 is between the voltage value of said input voltage (Vin) and the voltage value of Vs_2, and the voltage value of Vs_2 is between the voltage value of Vu_2 and the voltage value of the local ground voltage (Vs_1) of the first circuit block (B_1);
   the other circuit blocks are connected following similar patterns so that for an integer n that is larger than 1 and smaller than N, the n'th circuit block (B_n) is connected to a local power at a voltage Vu_n and a local ground at a voltage Vs_n, said n'th circuit block (B_n) provides an output signal (S_n) that switches with a switching amplitude substantially the same as the voltage difference between Vu_n and Vs_n, and said n'th circuit block (B_n) comprises a transistor (Mu_n) for providing a driving force to pull S_n toward Vu_n while Mu_n is enabled and a transistor (Md_n) for providing a driving force to pull S_n toward Vs_n while Md_n is enabled, where the voltage value of Vu_n is between the voltage value of said input voltage (Vin) and the voltage value of Vs_n, and the voltage value of Vs_n is between the voltage value of Vu_n and the voltage value of the local ground voltage (Vs_n−1) of the (n−1)'th circuit block (B_n−1); and
   the N'th circuit block (B_N) is connected to a local power at a voltage Vu_N and a local ground at a voltage Vs_N, said N'th circuit block (B_N) provides an output signal (S_N) that switches with a switching amplitude substantially the same as the voltage difference between Vu_N and Vs_N, and said N'th circuit block (B_N) comprises a transistor (Mu_N) for providing a driving force to pull S_N toward Vu_N while Mu_N is enabled and a transistor (Md_N) for providing a driving force to pull S_N toward Vs_N while Md_N is enabled, where the voltage value of Vu_N is between the voltage value of said input voltage (Vin) and the voltage value of Vs_N, and the voltage value of Vs_N is between the voltage value of Vu_N and the voltage value of the local ground voltage (Vs_N−1) of the (N−1)'th circuit block; and
   said output signals (S_1, S_2, ..., S_n, ..., S_N) are connected to the inputs of transformer(s) or decoupling circuit elements.

2. The transistors (Mu_1, Md_1, Mu_2, Md_2, ..., Mu_n, Md_n, ..., Mu_N, Md_N) used in the circuit blocks (B_1, B_2, ..., B_n, ..., B_N) of the electrical circuit in claim 1 comprise MOS transistors commonly used for logic circuits operating at voltages lower than one third of the peak voltage amplitude between Vin and Vss.

3. The MOS transistors in claim 2 have gate oxide thicknesses that are substantially the same as the gate oxide thicknesses of MOS transistors commonly used for logic circuits operating at voltages lower than one third of the peak voltage amplitude between Vin and Vss.

4. The MOS transistors in claim 2 have source-to-drain breakdown voltages that are lower than one third of the peak voltage amplitude between Vin and Vss.

5. A plurality of the circuit blocks (B__1, B__2, ..., B_n, ..., B_N) of the electrical circuit in claim 1 are manufactured on the same semiconductor substrate.

6. The switching frequencies of the output signals (S__1, S__2, ..., S_n, ..., S_N) of the circuit blocks (B__1, B__2, ..., B_n, ..., B_N) of the electrical circuit in claim 1 are higher than one million cycles per second.

7. The switching frequencies of the output signals (S__1, S__2, ..., S_n, ..., S_N) of the circuit blocks (B__1, B__2, ..., B_n, ..., B_N) of the electrical circuit in claim 1 are higher than ten million cycles per second.

8. A plurality of the output signals (S__1, S__2, ..., S_n, ..., S_N) of the circuit blocks (B__1, B__2, ..., B_n, ..., B_N) of the electrical circuit in claim 1 are connected to a transformer with a plurality of inputs.

9. The peak voltage amplitude between Vin and Vss of the electrical circuit in claim 1 is higher than 60 volts.

10. The peak voltage amplitude between Vin and Vss of the electrical circuit in claim 1 is higher than 100 volts.

11. An electrical circuit comprising:

An input voltage connection to an input voltage Vin,

An input ground connection to an input ground voltage Vss, and

A plurality of circuit blocks (B__1, B__2, ..., B_n, ..., B_N), where N is an integer larger than 3 and n is an integer greater than 1 and smaller than N, and said circuit blocks (B__1, B__2, ..., B_n, ..., B_N) are connected in a relationship as:

the first circuit block (B__1) is connected to a local power at a voltage Vu__1 and a local ground at a voltage Vs__1, and said first circuit block (B__1) provides an output signal (S__1) that switches with a switching amplitude substantially the same as the voltage difference between Vu__1 and Vs__1, where the voltage value of Vu__1 is between the voltage value of said input voltage (Vin) and the voltage value of Vs__1, and the voltage value of Vs__1 is between the voltage value of Vu__1 and the voltage value of said input ground voltage (Vss);

the second circuit block (B__2) is connected to a local power at a voltage Vu__2 and a local ground at a voltage Vs__2, and said second circuit block (B__2) provides an output signal (S__2) that switches with a switching amplitude substantially the same as the voltage difference between Vu__2 and Vs__2, where the voltage value of Vu__2 is between the voltage value of said input voltage (Vin) and the voltage value of Vs__2, and the voltage value of Vs__2 is between the voltage value of Vu__2 and the voltage value of the local ground voltage (Vs__1) of the first circuit block (B__1);

the other circuit blocks are connected following similar patterns so that for an integer n that is larger than 1 and smaller than N, the n'th circuit block (B_n) is connected to a local power at a voltage Vu_n and a local ground at a voltage Vs_n, and said n'th circuit block (B_n) provides an output signal (S_n) that switches with a switching amplitude substantially the same as the voltage difference between Vu_n and Vs_n, where the voltage value of Vu_n is between the voltage value of said input voltage (Vin) and the voltage value of Vs_n, and the voltage value of Vs_n is between the voltage value of Vu_n and the voltage value of the local ground voltage (Vs_n−1) of the (n−1)'th circuit block (B_n−1); and the N'th circuit block (B_N) is connected to a local power at a voltage Vu_N and a local ground at a voltage Vs_N, and said N'th circuit block (B_N) provides an output signal (S_N) that switches with a switching amplitude substantially the same as the voltage difference between Vu_N and Vs_N, where the voltage value of Vu_N is between the voltage value of said input voltage (Vin) and the voltage value of Vs_N, and the voltage value of Vs_N is between the voltage value of Vu_N and the voltage value of the local ground voltage (Vs_N−1) of the (N−1)'th circuit block; and said output signals (S__1, S__2, ..., S_n, ..., S_N) are connected to the inputs of transformer(s) or decoupling circuit elements.

12. The peak voltage amplitude between Vin and Vss of the electrical circuit in claim 11 is higher than 30 volts.

13. The peak voltage amplitude between Vin and Vss of the electrical circuit in claim 11 is higher than 60 volts.

14. The peak voltage amplitude between Vin and Vss of the electrical circuit in claim 11 is higher than 100 volts.

15. A plurality of the circuit blocks (B__1, B__2, ..., B_n, ..., B_N) of the electrical circuit in claim 11 are manufactured on the same semiconductor substrate.

16. The switching frequencies of the output signals (S__1, S__2, ..., S_n, ..., S_N) of the circuit blocks (B__1, B__2, ..., B_n, ..., B_N) of the electrical circuit in claim 11 are higher than one million cycles per second.

17. The switching frequencies of the output signals (S__1, S__2, ..., S_n, ..., S_N) of the circuit blocks (B__1, B__2, ..., B_n, ..., B_N) of the electrical circuit in claim 11 are higher than ten million cycles per second.

18. A plurality of the output signals (S__1, S__2, ..., S_n, ..., S_N) of the circuit blocks (B__1, B__2, ..., B_n, ..., B_N) of the electrical circuit in claim 11 are connected to a transformer with a plurality of inputs.

19. A plurality of the output signals (S__1, S__2, ..., S_n, ..., S_N) of the circuit blocks (B__1, B__2, ..., B_n, ..., B_N) of the electrical circuit in claim 11 are connected to a plurality of decoupling circuit elements.

20. The number (N) of the circuit blocks (B__1, B__2, ..., B_n, ..., B_N) of the electrical circuit in claim 11 is larger than 5.

\* \* \* \* \*